United States Patent [19]
Bae

[11] Patent Number: 5,698,350
[45] Date of Patent: Dec. 16, 1997

[54] LIGHT EXPOSURE METHOD FOR THE FABRICATION OF SEMICONDUCTOR DEVICES

[75] Inventor: Sang Man Bae, Bubaleub, Ichonkun, Rep. of Korea

[73] Assignee: Hyundai Electronics Industries Co., Ltd., Kyoungkido, Rep. of Korea

[21] Appl. No.: 695,297

[22] Filed: Aug. 9, 1996

Related U.S. Application Data

[62] Division of Ser. No. 266,173, Jun. 27, 1994, Pat. No. 5,571,641.

[30] Foreign Application Priority Data

Jun. 25, 1993 [KR] Rep. of Korea ............... 1993-11746

[51] Int. Cl.⁶ ............................................. G03F 9/00
[52] U.S. Cl. ........................... 430/5; 430/322; 359/564
[58] Field of Search .................. 430/5, 322; 355/53; 359/562, 563, 564

[56] References Cited

U.S. PATENT DOCUMENTS

| | | | |
|---|---|---|---|
| 4,223,083 | 9/1980 | Engstrom | 430/5 |
| 4,947,413 | 8/1990 | Jewell et al. | 359/563 |
| 5,208,629 | 5/1993 | Matsuo et al. | 355/53 |
| 5,387,484 | 2/1995 | Doany et al. | 430/5 |

FOREIGN PATENT DOCUMENTS

| | | |
|---|---|---|
| 2-101423 | 4/1990 | Japan . |
| 5-19447 | 1/1993 | Japan . |
| 5-188577 | 7/1993 | Japan . |
| 6-161092 | 6/1994 | Japan . |

*Primary Examiner*—S. Rosasci
*Attorney, Agent, or Firm*—Merchant, Gould, Smith, Edell, Welter & Schmidt, P.A.

[57] ABSTRACT

A light exposure method for fabrication of a semiconductor device and a dummy mask used therefor, capable of forming an ultra-fine pattern by diffracting incident light while controlling or cutting off light components vertically incident on a mask formed with a pattern, thereby increasing the depth of focus and improving the resolution. The dummy mask includes a transparent substrate provided at its upper surface with a diffracting pattern for primarily diffracting light from a light source incident on the dummy mask and at its lower surface with a blocking pattern for removing vertically incident light not diffracted by the diffraction patterns.

14 Claims, 6 Drawing Sheets

LIGHT EXPOSURE METHOD FOR THE FABRICATION OF SEMICONDUCTOR DEVICES

This is a Divisional of application Ser. No. 08/266,173, filed Jun. 27, 1994, U.S. Pat. No. 5,571,641 which application(s) are incorporated herein by reference.

BACKGROUND OF THE INVENTION

1. Field of the Invention

The present invention relates to a dummy mask used in a lithography process for semiconductor devices, and more particularly to an exposure process and a dummy mask adapted to form a pattern on a wafer by diffracted light to form an ultra-fine pattern.

2. Description of the Prior Art

Generally, the pattern of a mask is transferred onto a wafer by use of a stepper. Where the mask pattern is very fine, light incident on the mask is increased in diffraction angle when it emerges from the mask, thereby causing the resolution to be degraded. As a result, the pattern may be badly transferred onto the wafer.

A conventional light exposure technique for transferring a pattern onto a wafer will now be described, in conjunction with FIGS. 1 and 2.

FIG. 1 is a schematic view explaining a light path in a stepper. This light path is established when light 1 is vertically incident on a pattern mask 4.

Since the mask 4 is provided with a fine pattern, light transmitted through the mask 4 is increased in diffraction angle. As a result, the light emerging from a projection lens 5 is badly focused onto a wafer 6. Moreover, a great degradation in resolution may occur when the wafer 6 is inaccurately positioned.

For solving this problem, a light exposure method has been proposed involving an inclined light incidence capable of obtaining an improved depth of focus. For accomplishing such an inclined light incidence, a modified illumination mechanism for feeding light at a certain angle to a stepper is used. However, the modified illumination mechanism is limited in dimension and shape because it should be installed in a light exposure device. Moreover, line width of a pattern formed on a wafer may vary depending on the shape of the modified illumination mechanism. As a result, uniformity of the pattern line width may be degraded.

On the other hand, FIG. 2 is a schematic view illustrating another conventional light exposure method providing an improvement over the above-mentioned method illustrated in FIG. 1. This method uses a dummy mask involving light diffraction, for exposing a wafer to light.

As vertically incident light 1 passes through the dummy mask 2 fabricated in accordance with the diffraction principle, it is diffracted. The diffracted light passes through a Fresnel region 7 and then enters a pattern mask 4 formed with a predetermined pattern. The light emerging from the pattern mask 4 passes through a projection lens 5 and then transfers the pattern onto a wafer 6. The light incident on the pattern mask 4 after passing through the Fresnel region 7 includes main light components having an important effect on the formation of a pattern, namely, a zero-order diffracted light component 8, −1st diffracted light component 8' and +1st diffracted light component 8".

The diffracted light components 20' and 20" derived from the zero-order diffracted light component 8 vertically entering the pattern mask 4 having the pattern to be transferred onto the wafer 6 is incident on the projection lens 5 along the same paths as those in the case shown in FIG. 1. As a result, the zero-order diffracted light component 8 exhibits a small depth of focus. On the other hand, the −1st and +1st diffracted light components 8' and 8" are inclinedly incident on the pattern mask 4, thereby exhibiting a large depth of focus. In other words, the diffracted light components 9' and 9" incident on the projection lens 5, which are derived respectively from the −1st and +1st diffracted light components 8' and 8", exhibit a larger depth of focus than that of the diffracted light components 20' and 20". As a result, a pattern exhibiting a superior resolution can be obtained.

In FIG. 2, the reference numeral 9 denotes a light component diffracted at an angle beyond the incidence range of the projection lens 5.

Although an increase in depth of focus is realized by the inclined incidence, the conventional method still involves the problem encountered in formation of ultra-fine patterns because the wafer is exposed to a considerable amount of light components vertically incident on the mask formed with the pattern to be transferred.

SUMMARY OF THE INVENTION

Therefore, an object of the invention is to solve the above-mentioned problems encountered in the prior art and, thus, to provide a light exposure method for the fabrication of a semiconductor device and a diffraction mask used therefor, capable of forming an ultra-fine pattern by diffracting incident light while controlling or cutting off light components vertically incident on a photomask, formed with a pattern, thereby increasing the depth of focus and improving the resolution.

In accordance with one aspect, the present invention provides a light exposure method for fabrication of a semiconductor device, comprising the steps of: primarily diffracting light emitted from a light source of a light exposure device and illuminated onto a photomask formed with a predetermined pattern by a first pattern formed on a transparent substrate; and removing light not diffracted at the primary diffraction step and vertically incident on the photomask by a second pattern formed on the transparent substrate.

In accordance with another aspect, the present invention provides a diffraction mask for preventing light from being vertically incident on a photomask formed with a pattern, comprising: a transparent substrate having a predetermined thickness; a plurality of first regions arranged on a surface of the transparent substrate to be uniformly spaced apart from one another, thus forming a diffraction pattern each of the first regions having a predetermined shape and a predetermined size; and a plurality of second regions arranged on another surface of the transparent substrate disposed below the surface formed with the first regions to be uniformly spaced apart from one another, each of the second patterns having a predetermined shape and a predetermined size forming a control pattern forming that it is not overlapped with the diffraction pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Now, a preferred embodiment of the present invention will be described, in conjunction with FIGS. 3 and 4.

Figure 1:
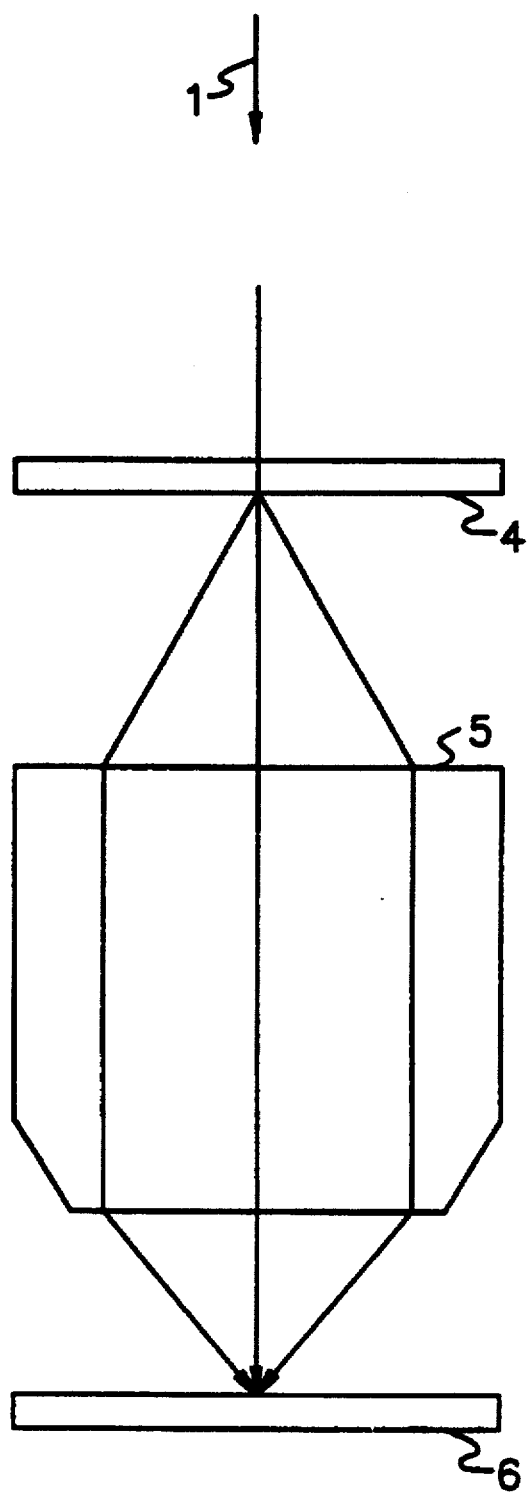
FIG. 1 is a schematic view illustrating a conventional light exposure condition for forming a pattern on a wafer.
Figure 2:
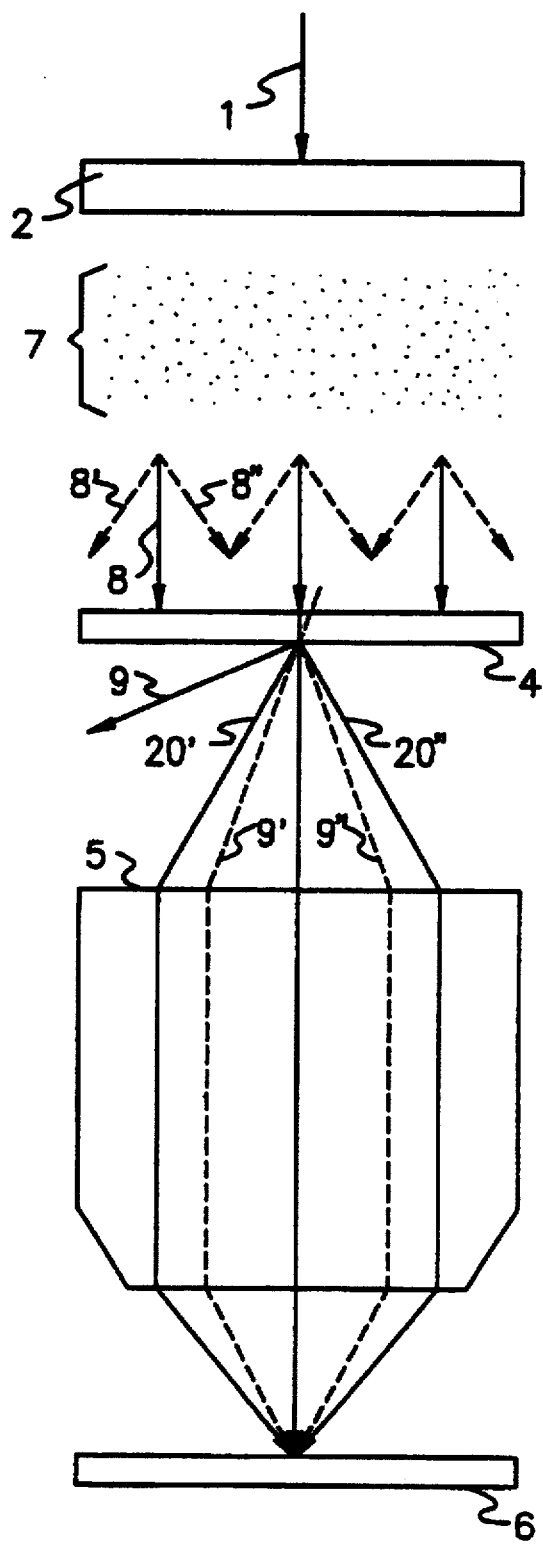
FIG. 2 is a schematic view illustrating a light exposure condition when a conventional dummy mask is used for removing vertical incident light.
Figure 3:
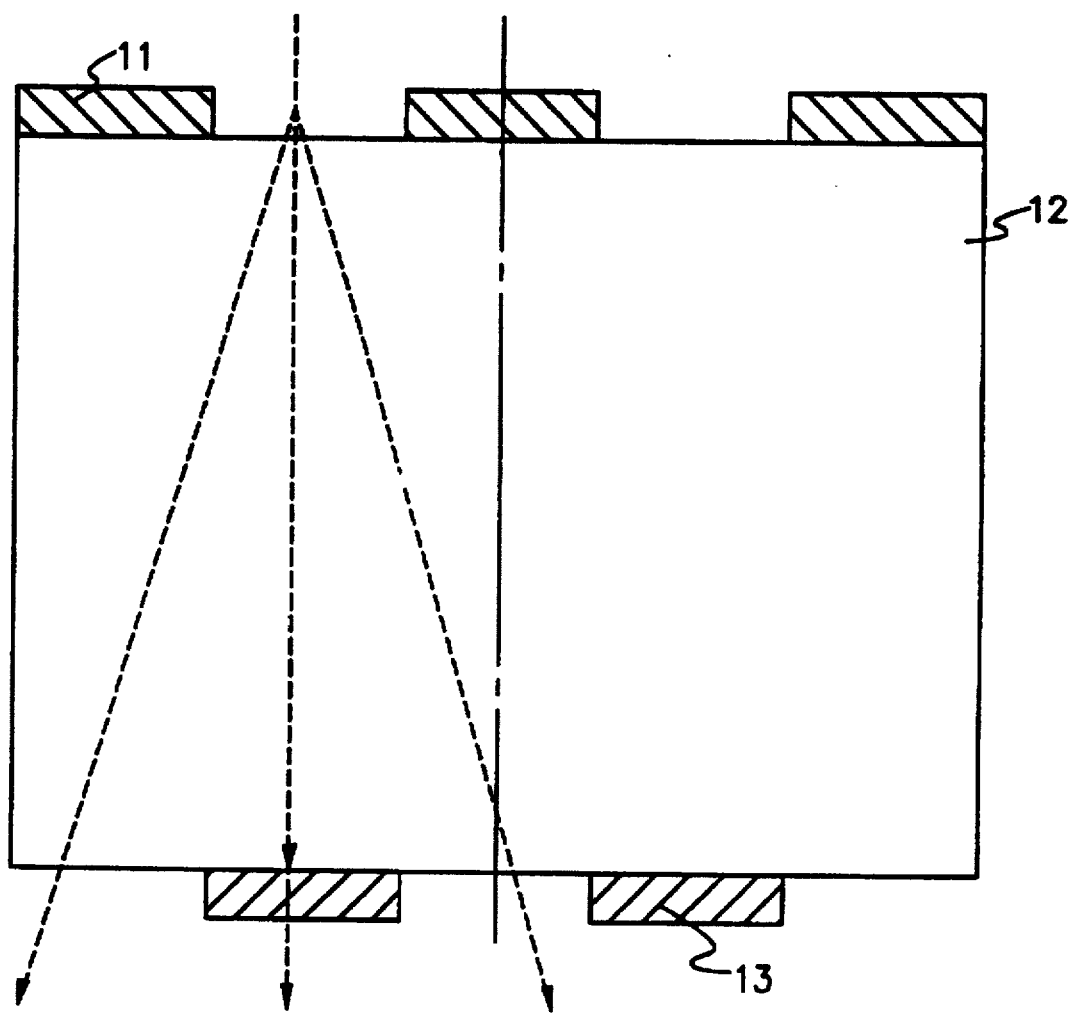
FIG. 3 is a schematic view illustrating a dummy mask for removing light vertically incident on a photomask formed with a pattern in accordance with the present invention.

FIG. 3 is a schematic view illustrating a dummy mask for removing light vertically incident on a photomask formed with a pattern in accordance with the present invention. As shown in FIG. 3, the dummy mask of the present invention includes a transparent substrate 12 provided at its upper surface with a plurality of diffracting regions 11 for primarily diffracting light from a light source incident on the dummy mask. At the lower surface, the transparent substrate 12 also has a plurality of control regions 13 for removing vertically incident light not diffracted by the diffracting regions 11. Of course, it is impossible to completely remove the light vertically transmitted through the transparent substrate 12 by the control regions 13. However, the control patterns 13 remove a considerable amount vertically incident light.

Although the dummy mask has been described as having the single transparent substrate 12 provided at its upper and lower surfaces respectively with the diffracting regions 11 for diffracting light and the control regions 13 for removing vertically incident light in accordance with the illustrated embodiment of the present invention, it may be constituted by a pair of separate transparent substrates respectively having the diffracting regions 11 and the control regions 13.

The transparent substrate 12 may be comprised of a quartz film or a silicon oxide glass (SOG) film. Both each diffracting region 11 and each control regions 13 may be comprised of a chromium film or a phase inversion material film such as SOG film.

Figure 4:
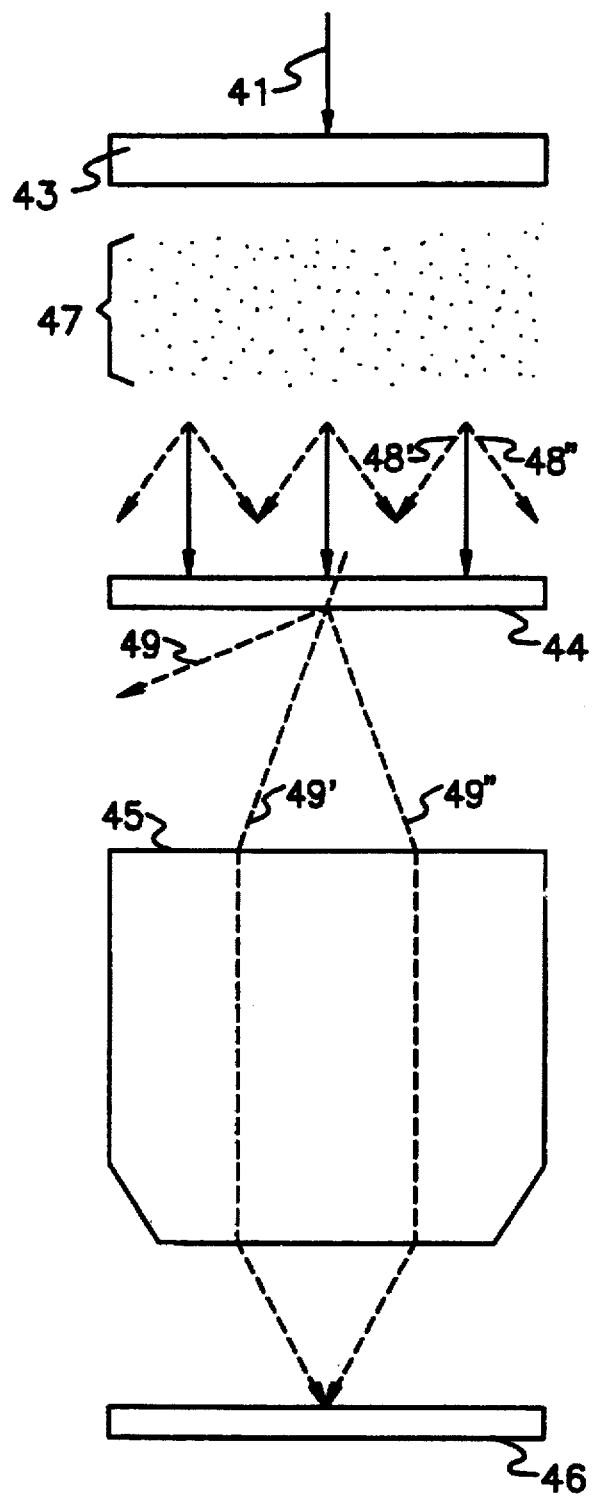
FIG. 4 is a schematic view illustrating a light exposure condition when the dummy mask of FIG. 3 is used for removing vertically incident light.

FIG. 4 is a schematic view illustrating a light exposure condition when the dummy mask of FIG. 3 is used for removing vertically incident light. In FIG. 4, the reference numeral 43 denotes a control mask which is the dummy mask having the diffracting regions 11 and the control regions 13 shown in FIG. 3. Light initially incident on the dummy mask 43 has its vertically traveling light component removed by the dummy mask 43 and then passes through a Fresnel region 47. The light emerging from the Fresnel region 47 enters the pattern mask 44 At this time, the light 55 passing through the dummy mask 43 is inclinedly incident on the pattern mask 44, as described in conjunction with FIG. 3. As a result, light components 49' and 49" passing through a projection lens 45 exhibit a large depth of focus. In FIG. 4, the reference numeral 49 denotes a light component diffracted at an angle beyond the incidence range on the projection lens 45. When all the zero-order diffracted vertically incident light components are removed by the control regions 13, a decrease in light exposure energy occurs, thereby lengthening the light exposure time. In this regard, it is preferred that the control structures 13 are made of a semitransparent material capable of transmitting light at a rate of 8 to 10% (the transmitted light is illustrated as element 15 in FIG. 3).

Figure 5:
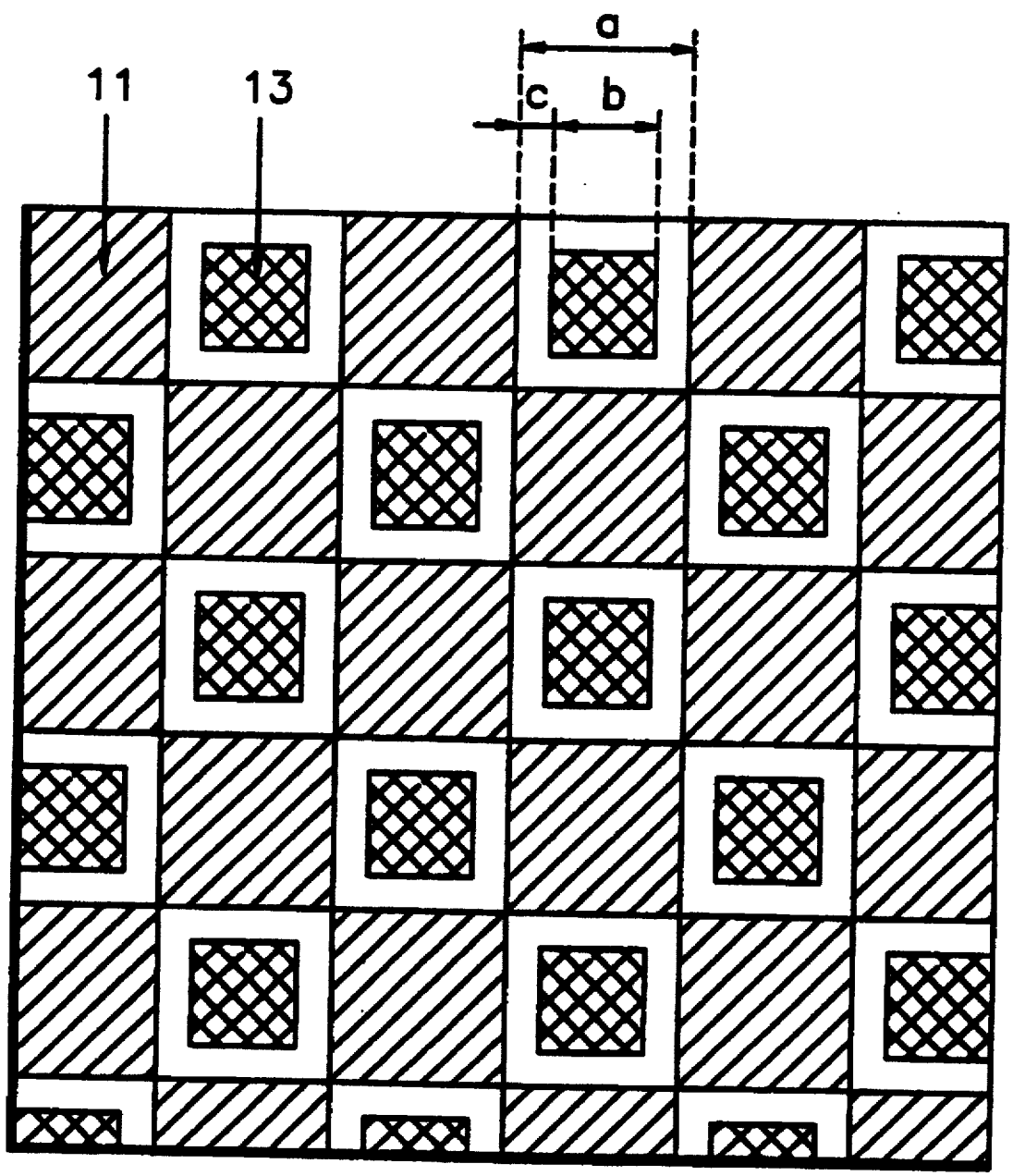
FIG. 5 is a plan view of the dummy mask of FIG. 3.
Figure 6:
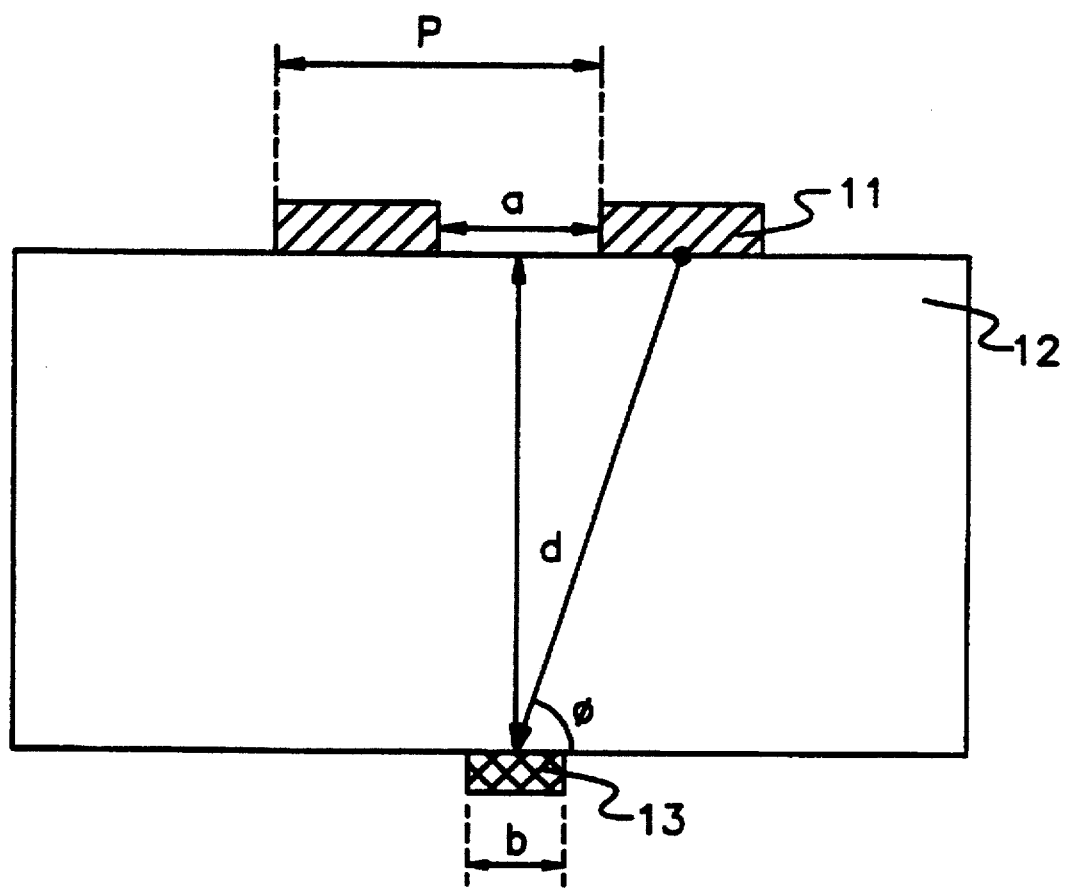
FIG. 6 is a schematic view of the dummy mask of FIG. 3, explaining the preferred arrangement and dimension relations between each diffraction pattern and each corresponding control pattern both provided at the dummy mask.

Referring to FIGS. 5 and 6, there is illustrated a method for forming the dummy mask 43 having the diffracting regions 11 and the control regions 13.

FIG. 5 is a plan view of the dummy mask in accordance with the present invention. The amount of light to which the wafer is exposed is controlled by appropriately adjusting the distance d between the diffracting regions 11 and the control regions 13 of the dummy mask, so as to conform the light exposure energy from the light source with the light sensitivity of a photoresist film formed on the wafer. Where a phase inversion material is used to form the diffracting regions 11, the thickness of each diffracting region 11 is also adjusted for the same purpose as mentioned above.

Both each diffracting regions 11 and each corresponding control region 13 are arranged to define optic-geometrically a predetermined angle $\phi$ therebetween, taking into consideration a numerical aperture value of a stepper used, as shown in FIG. 6. The distance d between the diffracting regions 11 and the control patterns 13 is sufficiently large to provide a Fraunhofer region. The arrangement of the control regions 13 is also appropriately adjusted for overcoming the drawback encountered in the light exposure method involving the inclined light incidence, namely, the non-uniformity in dimension of an image pattern. In particular, where the distance d between the diffracting regions 11 and the control regions 13 is given by the following equation, −1st and +1st light components emerging from the diffracting regions 11 pass centrally through each control regions 13:

$$d = ap/\lambda$$

where, a represents the distance between adjacent diffracting regions 11, p the sum of the width of each diffracting regions 11 and the distance a, and $\lambda$ the wavelength of light.

Preferably, the width of each control pattern 13 is p/2.

As apparent from the above description, the present invention provides a light exposure method for fabrication of a semiconductor device and a dummy mask used therefor, capable of enhancing the resolving power and the depth of focus in light exposure, thereby improving resolution of a fine pattern for achieving high integration of a semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A light exposure method for forming diffraction light in a photolithography process to fabricate a semiconductor device having fine patterns, comprising the steps of:

providing a transparent substrate having a first surface and a second surface, wherein the transparent substrate has on the first surface a plurality of diffraction regions being uniformly spaced apart from one another for diffracting incident light, wherein the transparent substrate has on the second surface a plurality of blocking regions being uniformly spaced apart from one another for blocking incident light, and wherein the blocking regions do not overlap the diffraction regions along an axis normal to the surfaces of the transparent substrate;

diffracting light from a light source using the diffraction regions; and blocking vertically incident light not being diffracted by the diffraction regions using the blocking regions.

2. A light exposure method in accordance with claim 1, wherein the first surface is spaced apart from the second surface in a direction of the axis normal to the surface of the transparent substrate by a distance d determined according to the relationship:

$$d = ap/\lambda$$

where a represents a spacing distance between the diffraction regions, p represents a sum of the width of the diffraction regions and the spacing distance between the diffraction regions and λ represents the wavelength of the incident light, a, p and λ being measured in consistent units of measurements.

3. A light exposure method in accordance with claim 2, wherein each of the blocking regions has a width larger than ½ of the sum of the width of the diffraction regions and the spacing distance between the diffraction regions.

4. A light exposure method in accordance with claim 3, wherein the transparent substrate comprises a pair of separate transparent substrate bodies, the pair of substrate bodies being adjacently arranged, and being respectively formed with the diffraction regions and the blocking regions such that the diffraction regions and the blocking regions are disposed on opposing surfaces of the substrate.

5. A light exposure method in accordance with claim 3, wherein the transparent substrate comprises a single transparent substrate body having an upper surface formed with the diffraction regions and a lower surface formed with the blocking regions.

6. A light exposure method in accordance with claim 3, wherein the blocking regions are made of phase inversion material.

7. A light exposure method in accordance with claim 3, wherein blocking regions are made of material capable of transmitting the incident light at a rate of 8% to 10%.

8. A method for forming diffraction light in a photolithography process to fabricate a semiconductor device having fine patterns, comprising the steps of:

diffracting light from a light source using a first dummy mask, which has a plurality of diffraction regions being uniformly spaced apart from one another for diffracting incident light;

blocking vertically incident light not being diffracted by the diffraction regions using a second dummy mask, which has a plurality of blocking regions being uniformly spaced apart from one another for blocking incident light, wherein the blocking regions do not overlap the diffraction regions along an axis normal to the first and second dummy masks;

transmitting diffracted light through a pattern mask having a main pattern to be projected on a wafer; and projecting diffracted light into a lens positioning over a wafer;

whereby the first and second dummy masks reduce an amount of light vertically incident on a wafer.

9. A light exposure method in accordance with claim 8, wherein a first surface of the first dummy mask is spaced apart from a second surface of the second dummy mask in a direction of the axis normal to the first and second surfaces by a distance d determined according to the relationship:

$$d = ap/\lambda$$

where a represents a spacing distance between the diffraction regions, p represents a sum of the width of the diffraction regions and the spaced distance between the diffraction regions and λ represents the wavelength of the incident light, a, p and λ being measured in consistent units of measurements.

10. A light exposure method in accordance with claim 9, wherein each of the blocking regions has a width larger than ½ of the sum of the width of the diffraction regions and the spacing distance between the diffraction regions.

11. A light exposure method in accordance with claim 10, wherein the diffraction regions and the blocking regions are respectively formed on a first and second separate transparent substrate bodies, the first and second substrate bodies being adjacently arranged, such that the diffraction regions and the blocking regions are disposed on opposing surfaces of the substrate bodies.

12. A light exposure method in accordance with claim 10, wherein the diffraction regions and the blocking regions are respectively formed on an upper surface and a lower surface of a single transparent substrate.

13. A light exposure method in accordance with claim 10, wherein the blocking regions are made of phase inversion material.

14. A light exposure method in accordance with claim 10, wherein the blocking regions are made of material capable of transmitting the incident light at a rate of 8% to 10%.

* * * * *